United States Patent
Chen

(10) Patent No.: US 6,788,400 B2
(45) Date of Patent: Sep. 7, 2004

(54) METHOD AND APPARATUS FOR DETECTING ABERRATIONS IN AN OPTICAL SYSTEM

(75) Inventor: J. Fung Chen, Cupertino, CA (US)

(73) Assignee: ASML Masktools B.V., Veldhoven (NL)

(*) Notice: Subject to any disclaimer, the term of this patent is extended or adjusted under 35 U.S.C. 154(b) by 0 days.

(21) Appl. No.: 10/001,196

(22) Filed: Dec. 4, 2001

(65) Prior Publication Data

US 2002/0088951 A1 Jul. 11, 2002

Related U.S. Application Data

(63) Continuation-in-part of application No. 09/729,695, filed on Dec. 6, 2000.

(51) Int. Cl.[7] ................................................. G01B 9/00
(52) U.S. Cl. ....................................................... 356/124
(58) Field of Search ............................... 356/124–127, 356/239.2–239.6, 342, 399, 400–401; 250/492.22, 398; 430/5, 22, 30; 359/566

(56) References Cited

U.S. PATENT DOCUMENTS

| | | | |
|---|---|---|---|
| 5,776,645 A | 7/1998 | Barr et al. | |
| 6,130,747 A | 10/2000 | Nomura et al. | |
| 6,296,977 B1 | * 10/2001 | Kaise et al. | 430/30 |
| 2002/0080491 A1 | * 6/2002 | Goto | 359/566 |

FOREIGN PATENT DOCUMENTS

| | | |
|---|---|---|
| EP | 0 595 196 | 5/1994 |
| EP | 0 849 638 | 6/1998 |
| JP | 11304653 | 11/1999 |
| JP | 2000146758 | 5/2000 |
| WO | 99/47981 | 9/1999 |
| WO | 00/31592 | 6/2000 |

* cited by examiner

*Primary Examiner*—Tu T. Nguyen
(74) *Attorney, Agent, or Firm*—McDermott Will & Emery LLP

(57) ABSTRACT

A method of detecting aberrations associated with a projection lens utilized in an optical lithography system. The method includes the steps of forming a mask for transferring a lithographic pattern onto a substrate, forming a plurality of non-resolvable features disposed on the mask, where the plurality of non-resolvable features are arranged so as to form a predetermined pattern on the substrate, exposing the mask using an optical exposure tool so as to print the mask on the substrate, and analyzing the position of the predetermined pattern formed on the substrate and the position of the plurality of non-resolvable features disposed on the mask so as to determine if there is an aberration. If the position of the predetermined pattern formed on the substrate differs from an expected position, which is determined from the position of the plurality of non-resolvable features, this shift from the expected position indicates the presence of an aberration.

21 Claims, 11 Drawing Sheets

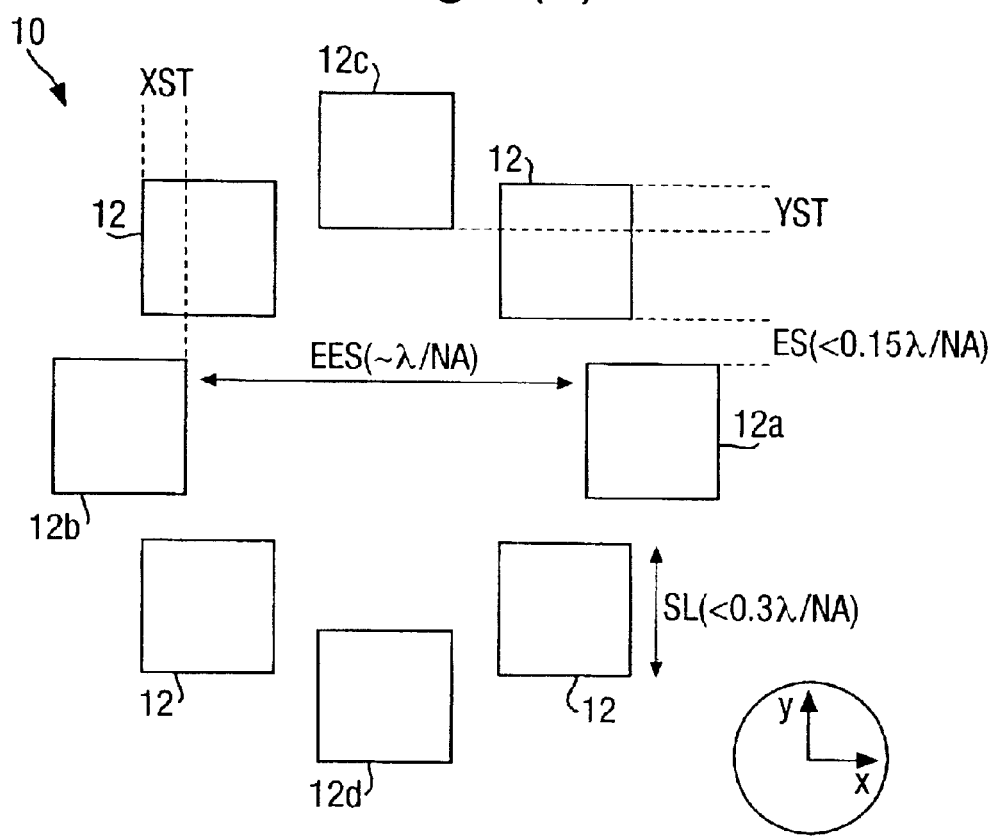

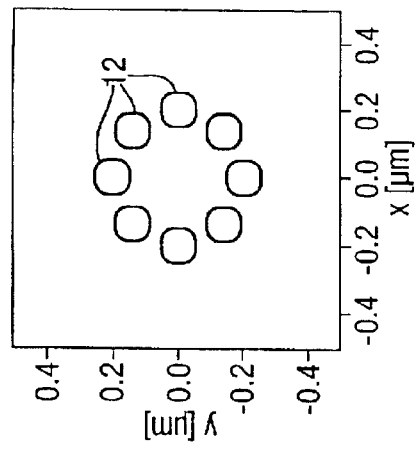
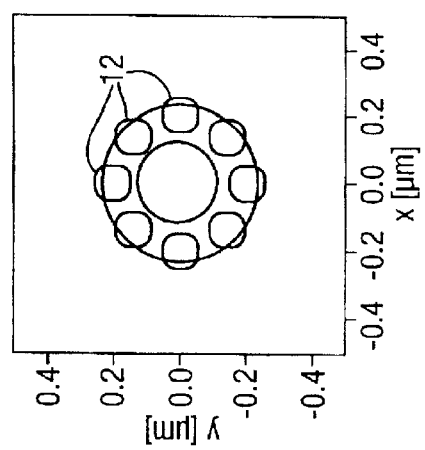
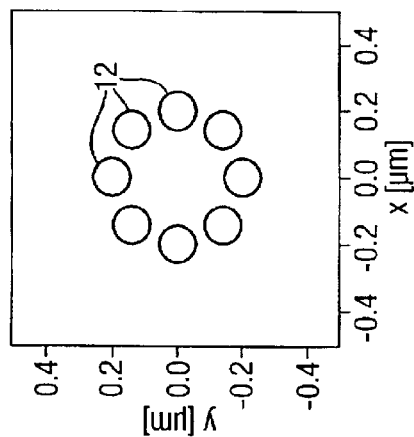
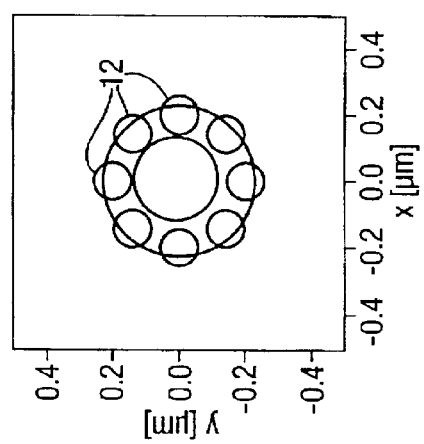
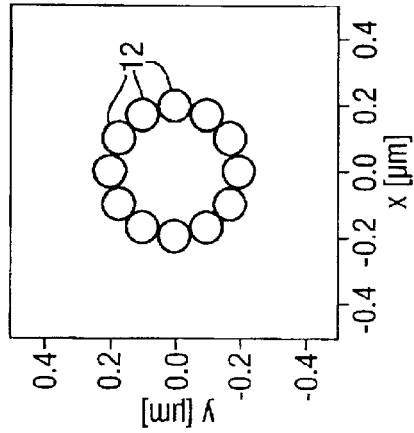
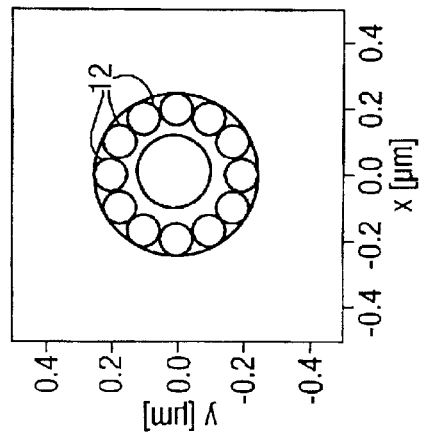

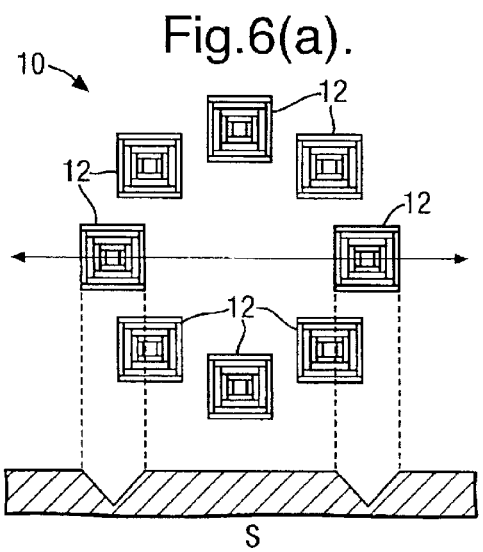
Fig.6(a).
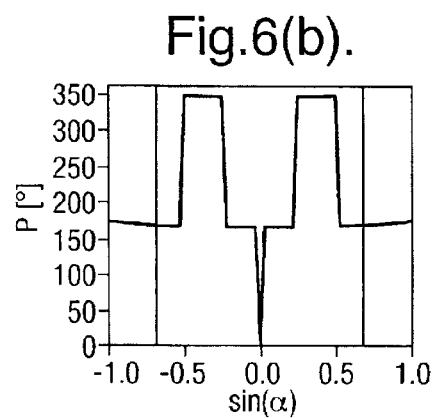
Fig.6(b).
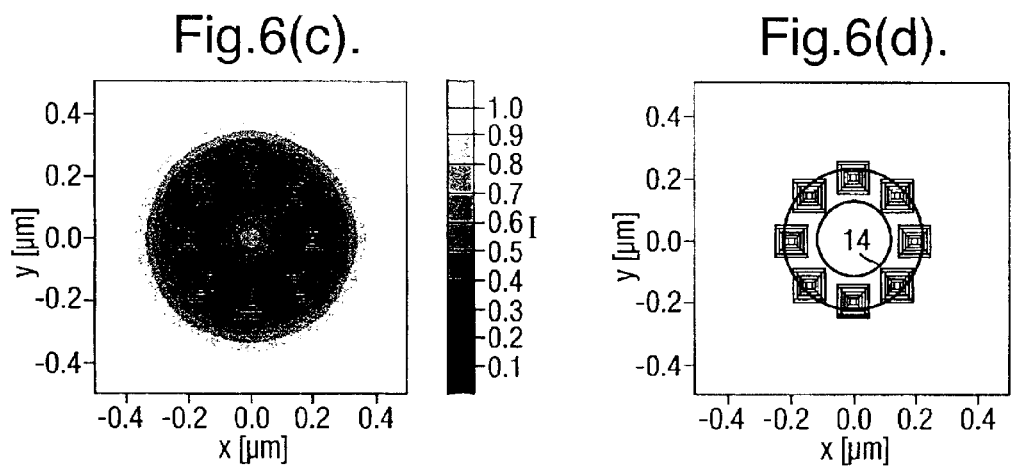
Fig.6(c).
Fig.6(d).
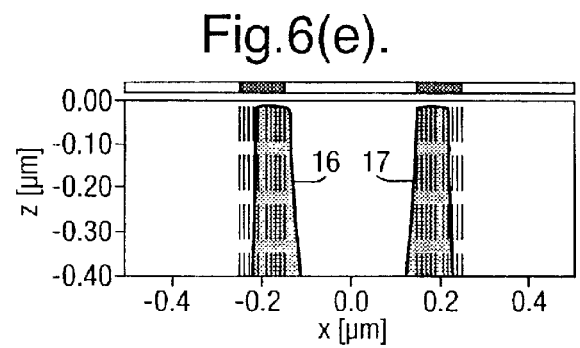
Fig.6(e).

METHOD AND APPARATUS FOR DETECTING ABERRATIONS IN AN OPTICAL SYSTEM

RELATED APPLICATIONS

This application is a continuation-in-part of U.S. application Ser. No. 09/729,695, filed on Dec. 6, 2000.

The present invention relates to the detection of aberrations associated with optical systems (such as the projection system and/or radiation system) utilized in a lithographic projection apparatus, and more particularly to the design, layout and application of aberration monitoring structures that can be used to monitor the optical system performance during the manufacture of semiconductor (and other) devices using such apparatus. A lithographic projection apparatus generally comprises:

a radiation system for supplying a projection beam of radiation;

a support structure for supporting patterning means, the patterning means serving to pattern the projection beam according to a desired pattern;

a substrate table for holding a substrate; and a projection system for projecting the patterned beam onto a target portion of the substrate.

The term "patterning means" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using such a lithographic projection apparatus, a pattern in a mask (or other patterning means) is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an integrated circuit (IC). Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes may be obtained, for example, from the book "Microchip Fabrication: A Practical Guide to Semiconductor Processing", Third Edition, by Peter van Zant, McGraw Hill Publishing Co., 1997 ISBN 0-07067250-4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The current state of IC fabrication requires lithography processes to provide for patterning feature line widths to near one-half of the exposure wavelength. For the 150 nm device generation, the KrF excimer laser (DUV; 248 nm) is typically selected as the exposure source of choice. Recent research and development efforts have further demonstrated the possibility of utilizing the KrF excimer laser for the 130 nm device generation. This is achieved inter alia by employing multiple resolution enhancement techniques (RET), such as attenuated phase-shifting masks (attPSM) and off-axis illumination (OAI), in combination with optical proximity correction (OPC) techniques. Possible alternatives to the foregoing techniques are to use a shorter exposure wavelength, such as an ArF excimer laser with a wavelength of 193 nm, or to use a lens with a super-high Numerical Aperture (NA), e.g. NA=0.8 or more. However, both these alternatives require extensive capital expenditure in new apparatus, and it is generally desirable to postpone such expenditure if at all feasible. Consequently, integrated device manufacturers would generally like to get the most out of existing DUV systems before making the switch to successor apparatus.

Regardless of the excimer laser utilized in the fabrication process, the fabrication of devices having critical dimensions of 150 nm or less requires that the near-diffraction-limited lens utilized in the fabrication process be substantially aberration free. As is known, aberrations can be caused by various sources, such as a defective lens or an aging laser that emits a beam having a frequency shifted from the desired value. Accordingly, it is desirable to verify lens performance (i.e. qualify the lens) prior to installation, and then to subsequently monitor the lens performance during use (e.g. in an IC fabrication process).

During the lens manufacturing process, the lens performance can be fully tested interferometrically. Typically, the lens is first qualified at the factory and then again during the initial installation in the field. One common practice utilized for lens qualification is to print wafers and then measure the dimensions of the minimum feature width, or the Critical Dimension (CD). During this qualification process, both "vertical" and "horizontal" features are measured (i.e. features extending in two orthogonal directions on the substrate plane, such as along X and Y axes). In some instances, the CD for 45-degree features is also measured. In order to verify lens performance, a sufficient number of CD measurements is required across the entire exposure field. The results of the CD measurements are then analyzed to determine whether or not the lens performance is acceptable.

Although the CD measurement method provides a method of evaluating the performance of the lens, it is not a simple task to correlate the CD data to the "signature" of the lens aberration. Accordingly, there have been efforts to perform a direct observation of lens aberrations. For example, an article by Toh et al. entitled "Identifying and Monitoring of Lens Aberrations in Projection Printing," SPIE Vol. 772, pp. 202–209 (1987) described methods for measuring the effects of relatively large lens aberrations of about $0.2\lambda$, where $\lambda$ is the exposure wavelength. However, for today's near-diffraction-limited optics, any lens aberration is likely to be in the neighborhood of $0.05\lambda$, or smaller. For 130 nm features, a $0.05\lambda$ lens aberration translates to a 12.4 nm dimensional error when utilizing the KrF exposure source. Accordingly, if the feature CD budget (i.e. error tolerance) is assumed to be $\pm 10\%$ of the target feature width, a 12.4 nm error consumes almost the entire CD budget.

In an article by Gortych et al. entitled "Effects of Higher-Order Aberrations on the Process Window," SPIE Vol. 1463, pp. 368–381 (1991) it was demonstrated that higher-order lens aberrations could deteriorate lithographic process windows. Unfortunately, the higher-order lens aberrations are difficult to eliminate after the photolithography system is assembled. In an article by Brunner entitled "Impact of Lens Aberration on Optical Lithography," INTERFACE 1996 Proceedings, pp. 1–27 (1996) simulation was utilized to demonstrate the negative impact of near-wavelength features due to several first-order lens aberrations. Specifically, it was possible to observe coma aberrations by examining how the contact features were printed when utilizing an attenuated PSM. It is also known that lens aberrations can be balanced with custom off-axis illumination. Others have attempted to make direct measurements of various kinds of lens aberrations in an effort to achieve better CD control.

An article by Farrar et al. entitled "Measurement of Lens Aberrations Using an In-Situ Interferometer Reticle," Advanced Reticle Symposium, San Jose, Calif. (Jun. 1999) reported the use of an in-situ interferometer reticle to directly measure lens aberration. According to Farrar, it was possible to derive lens aberrations up to 37 Zernike terms. Although Farrar claims that the method is accurate and repeatable, it involves hundreds or thousands of registration type measurements (i.e. the measuring of the shift in relation to the intended feature position). As such, while Farrar's method may be accurate and repeatable, with the need for such exhaustive measurements, the method is clearly very time consuming, and therefore likely unusable in a manufacturing-driven environment. Furthermore, it is conceivable that minute lens aberrations can drift over time for various reasons (e.g. as a result of the periodic preventive maintenance performed on a system). Thus, as it is critical to monitor lens performance on a periodic basis, the use of Farrar's method, which requires substantial measurements and calculations, is impractical. Accordingly, there is a need to be able to monitor the lens aberration directly from the printed product wafers.

In an effort to accomplish this objective, Dirksen et al. (see, for example, PCT Patent Application WO 00/31592) proposed a method for directly monitoring lens aberration from the printed wafers. According to Dirksen's method, the lens monitor comprises simple circular features on the reticle. More specifically, the circular feature is a chromeless feature that has been etched into the vitreous substrate of the reticle. The etched depth is typically $\lambda/2$ and the diameter is about $(\lambda/NA)$, where NA is the numerical aperture of the projection lens. According to Dirksen, the method has proven to be effective. Further, the structure is simple and small enough to be readily placed throughout the entire exposure field.

Still, there are a number of issues concerning the use of Dirksen's lens aberration monitor. First, the depth of the lens monitor feature on the mask needs to be etched to approximately half of the wavelength. For a special-purpose mask, there is no problem dedicating an extra (or special) mask making process step to fabricate such a feature. However, for production reticle types, such as a binary chrome reticle or attPSM, an extra mask making process step necessary to create such a monitor is a costly and time-consuming process. Alternating PSM (altPSM) or chromeless PSM (CLM) would also require the extra mask making process step. Further, since the Dirksen monitor calls for a different etch depth in the quartz substrate as opposed to the π-phase, it requires a special etch time and must be done separately.

A second issue with Dirksen's lens monitor is that it is vulnerable to phase error that may result from the quartz etch process during mask formation. More specifically, referring to FIGS. 1(a)–1(f) (in which S denotes a quartz mask substrate), for an exacerbated phase error, the quartz etch process causes a sloped edge profile on the mask as shown in FIG. 1(a). In such a case, the Dirksen monitor loses all of the sensitivity to indicate any possible lens aberration. However, when there is no phase-error on the mask, as shown in FIG. 1(d), the Dirksen monitor is effective for detecting lens aberrations. FIGS. 1(b) and 1(e) illustrate a cross-sectional view of the printed resist pattern resulting from the "sloped" Dirksen monitor structure of FIG. 1(a) and the "ideal" Dirksen monitor structure of FIG. 1(d), respectively.

It is noted that the printing conditions utilized to produce the resist profiles illustrated in FIGS. 1(b) and 1(e) were as follows: a 0.68NA with 0.8 partial coherence at +0.1 μm de-focus, utilizing a Shipley UV6 resist with a thickness of 0.4 μm on an organic BARC (AR2) on top of a polysilicon wafer. The simulation introduced a +0.025λ coma for both X & Y (Z7 and Z8 Zernike terms).

Upon a closer examination of the ring-shaped resist patterns formed by the Dirksen monitor structures, as shown for example in FIGS. 1(c) and 1(f), it is clear that the inner ring of the printed resist pattern has a relatively sloppy resist profile in contrast to the steep profile formed by the outer ring structure. The reason for this variation is that the outer-ring resist pattern is formed by the phase change in the mask, while the inner ring resist pattern is formed without any such phase change. Specifically, the inner ring resist pattern is formed via the attenuation of the exposure wavelength that is passed through the center of the Dirksen monitor pattern. In other words, the two resist profiles (i.e. the inner ring and the outer ring) are formed by two inherently different log-slopes of the respective aerial images. The difference in resist profiles can lead to erroneous registration measurements, which can cause a misinterpretation of the lens aberration in question.

It is noted that it is possible to observe a slight coma with the Dirksen lens aberration monitor, as shown in FIGS. 1(e) and (f). Specifically, the width of the ring is different on the left side as compared to the right side. It is further noted that it is difficult to observe this coma in the "sloped" Dirksen monitor, as shown in FIGS. 1(b) and 1(c).

Accordingly, in view of the foregoing problems, there remains a need for a lens monitor that allows for the detection of lens aberrations, but which is not easily impaired by slight imperfections in the mask making process. It is also desirable that the lens monitor structures be small enough such that they can be positioned in numerous places between or beside production die for in-situ lens monitoring purposes. It is also desirable that the lens monitor can be fabricated without requiring extra mask making process steps.

In an effort to solve the aforementioned needs, it is an object of the present invention to provide a lens monitor capable of detecting lens aberrations. It is a further object of the invention that said lens monitor comprise aberration analysis structures of sufficiently small size to allow the monitor to be utilized for in-situ production monitoring. Moreover, it is an object of the invention that the manufacture of said monitor should not require extra processing steps, e.g. during mask formation, and that the functionality of the lens monitor should not be significantly impaired by minor imperfections in its manufacture, e.g. in the mask formation process.

More specifically, the present invention relates to a lens aberration monitor for detecting lens aberrations. The monitor comprises a plurality of non-resolvable features (disposed, for example, on a mask). The plurality of non-resolvable features is arranged so as to project a predetermined test pattern on the substrate, which test pattern is then utilized to detect lens aberrations. The size of the monitor is such as to fit within the object field of the lithographic apparatus in conjunction with a device pattern, corresponding to a device (e.g. an integrated circuit) to be formed on the substrate; for example, the monitor is small enough to fit on a mask containing an IC pattern.

The present invention also relates to a method of detecting aberrations associated with an optical system (radiation system and/or projection lens) utilized in an optical lithography system as specified in the opening paragraph. In that context, the method comprises the steps of:

providing said desired pattern to comprise a monitor having a plurality of non-resolvable features, where the plurality of non-resolvable features is arranged so as to form a predetermined test pattern when projected on the substrate;

projecting the monitor onto the substrate using the projection system, and;

analyzing the position of said predetermined test pattern and the position of the plurality of non-resolvable features in the monitor so as to determine if there is an aberration.

In addition to said monitor, said desired pattern may further comprise a device pattern, corresponding to an integrated device layer to be formed on said substrate.

As explained below, if the position of the predetermined test pattern differs from an expected position, which is determined from the position of the plurality of non-resolvable features, this shift from the expected position indicates the presence of an aberration.

As described in further detail below, the present invention provides significant advantages over the prior art. Most importantly, the present invention provides a lens monitor capable of detecting very subtle lens aberrations. Furthermore, as the overall size of the lens monitor structures is sufficiently small, the monitor structures can be positioned in a sufficient number of positions in so as to allow for monitoring of the entire exposure field.

If the monitor is disposed on a mask, then it is substantially immune to deficiencies in the mask formation process utilized to form the monitor. In such a case, the lens monitor of the present invention is suitable for in-situ monitoring, as the lens monitor can be formed utilizing the same mask formation process required to form the production mask, and therefore does not require any additional mask formation processing steps. Yet another advantage is that the effectiveness of the lens monitor is relatively insensitive to both the "sloped" phase edges and the "corner rounding" effects that are generally inherent to the mask making process.

Additional advantages of the present invention will become apparent to those skilled in the art from the following schematic drawings and the accompanying detailed description of exemplary embodiments of the invention, whereby:

FIG. 3(a) illustrates an exemplary lens aberration monitor structure in accordance with the present invention.

FIGS. 3(b)–3(g) illustrate exemplary variations of the lens aberration monitor structure illustrated in FIG. 3(a) and the printing performance thereof.

Figure 4A:
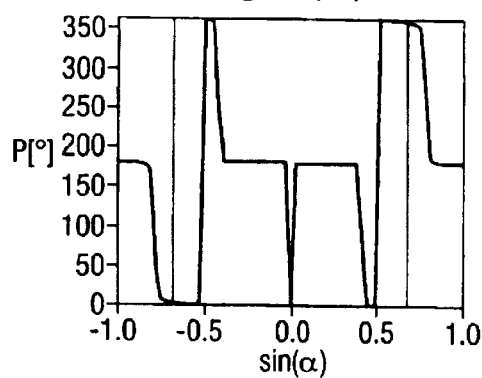

FIG. 4(a) illustrates the object phase spectrum produced by the Dirksen monitor structure of FIG. 1.

Figure 4D:
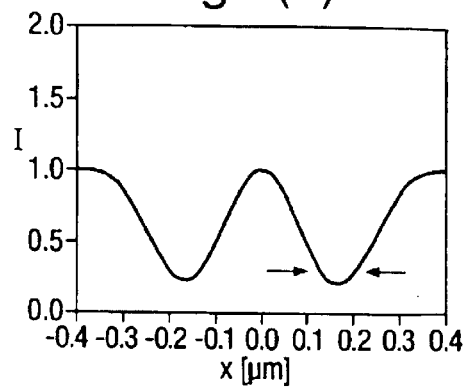
Figure 4B:
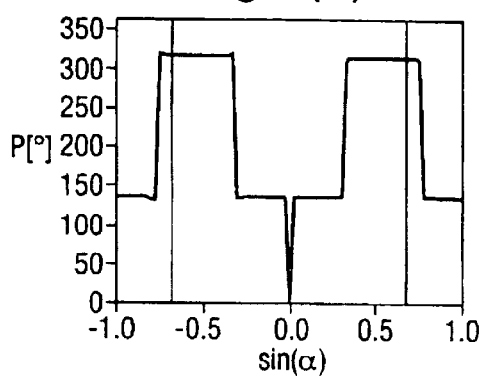

FIG. 4(b) illustrates the object phase spectrum produced by the "ring-like" monitor structure of FIG. 2.

Figure 4E:
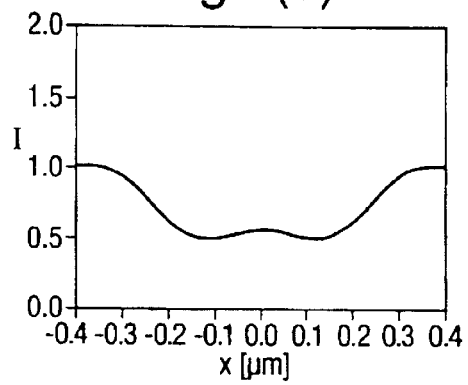
Figure 4C:
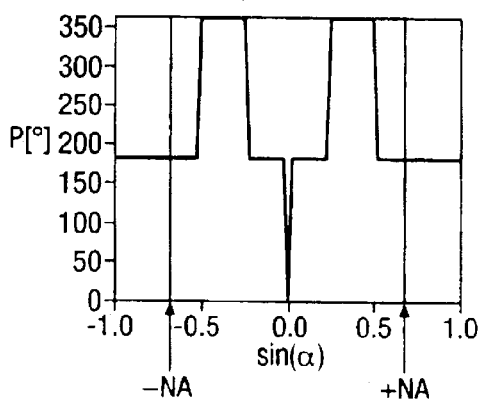

FIG. 4(c) illustrates the object phase spectrum produced by the lens aberration monitor structure illustrated in FIG. 3(a).

FIG. 4(d) illustrates a 1-D cross-sectional aerial image produced by the Dirksen monitor structure of FIG. 1.

FIG. 4(e) illustrates a 1-D cross-sectional aerial image produced by the "ring-like" monitor structure of FIG. 2.

Figure 4F:
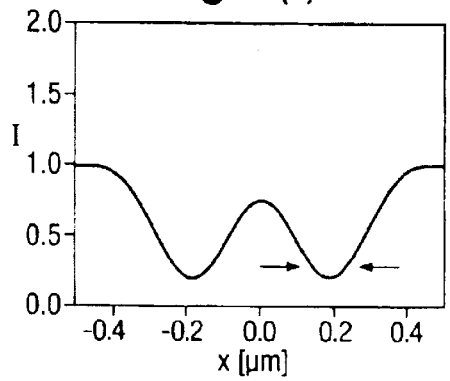

FIG. 4(f) illustrates a 1-D cross-sectional aerial image produced by the lens aberration monitor structure of FIG. 3(a).

Figure 5B:
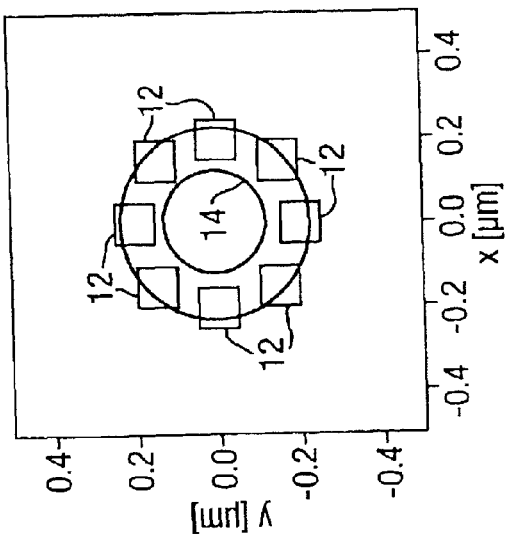
Figure 5A:
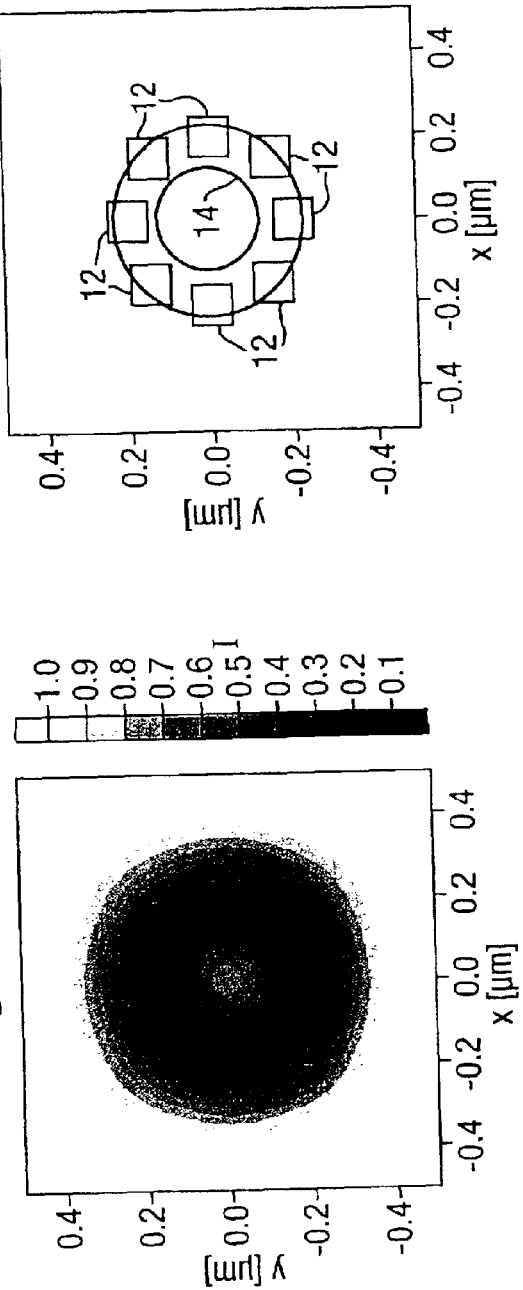
Figure 5C:
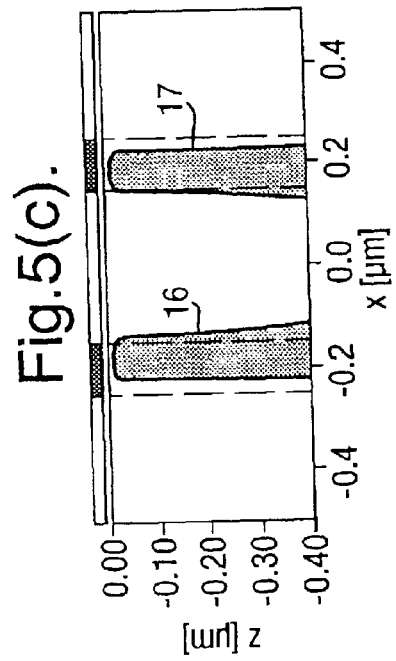

FIGS. 5(a)–5(c) illustrates the actual printing performance of the lens aberration monitor structure illustrated in FIG. 3(a).

FIG. 6(a) illustrates a top and cross-sectional view of the lens aberration monitor structure of FIG. 3(a), wherein the mask formation process results in the non-resolvable features having sloped edges.

FIG. 6(b) illustrates the object phase spectrum produced by the lens aberration monitor structure illustrated in FIG. 6(a).

FIG. 6(c) illustrates a two-dimensional aerial image of the lens aberration monitor structure illustrated in FIG. 6(a) as projected by the projection lens.

FIG. 6(d) illustrates a top view of the original resist patterns of FIG. 6(a) overlapped with the resulting lens aberration monitor structure printed on a wafer.

FIG. 6(e) is a cross-sectional view of the resulting lens aberration monitor structure corresponding to the monitor structure of FIG. 6(a).

FIGS. 7(a)–7(d) demonstrate the ability of the lens aberration monitor of the present invention to be utilized in conjunction with a 6% attPSM or a binary chrome mask.

FIGS. 8(a)–8(h) illustrate the capability of the lens aberration monitor of the present invention to detect lens aberrations.

Figure 9:
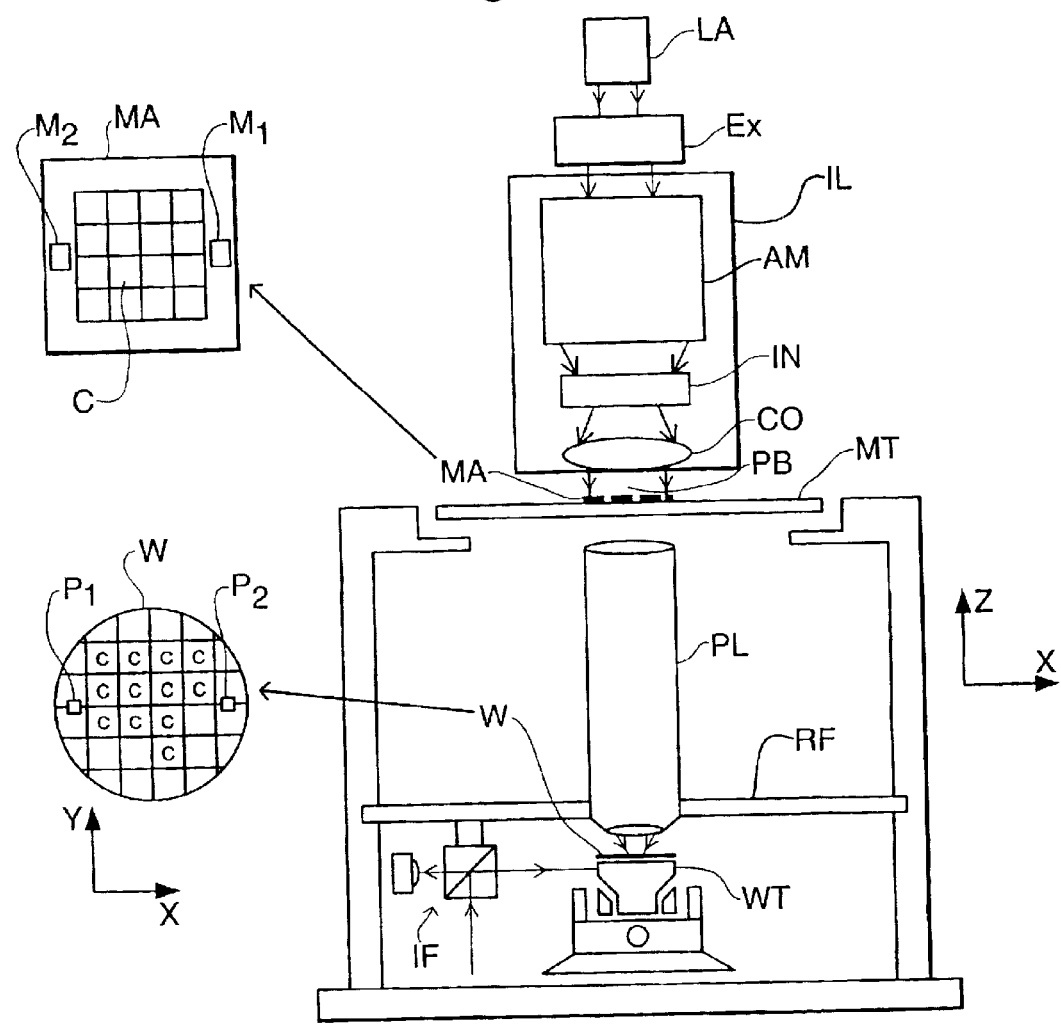

FIG. 9 depicts a lithographic projection apparatus suitable for use with the current invention.

In the drawings, like features are indicated by like reference symbols.

The following detailed description of the lens aberration monitor of the present invention relates to both the lens aberration monitor itself, as well as a method of forming the monitor. It is noted that, in an effort to facilitate the understanding of the present invention, the following description details how the monitor can be utilized to form ring-shaped structures on a mask. However, it is also noted that the present invention is not limited to such ring-shaped structures; clearly, other shapes are possible. Moreover, said structures do not have to be formed on a mask; they can, for example, be generated using other patterning means.

From the observations described above with regard to the Dirksen monitor, the inventor of the present invention initially thought that the resist profile of the inner ring of Dirksen's monitor structure could be improved by modifying the monitor such that it exhibited a ring-like structure. In other words, the degraded/sloppy resist profile of the inner ring of Dirksen's monitor structure could be corrected by creating a phase change at the center of the structure. However, contrary to the initial thoughts, the inventor of the present invention determined that creating a phase change at the center of the Dirksen structure did not result in the corresponding resist profile exhibiting a ring-like structure. Moreover, the resulting resist profile was essentially useless for monitoring lens aberration.

Figure 1A:
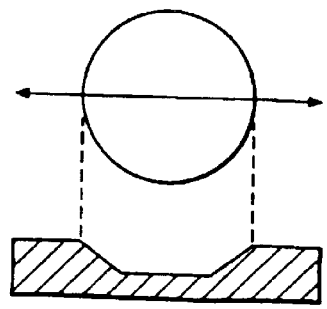
FIG. 1(a) illustrates a top and cross-sectional view of a "sloped" Dirksen lens aberration monitor structure.
Figure 1D:
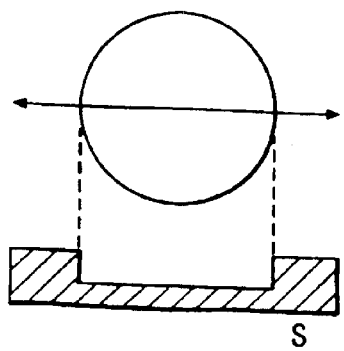
FIG. 1(d) illustrates a top and cross-sectional view of an "ideal" Dirksen lens aberration monitor structure.
Figures 1B, 1E:
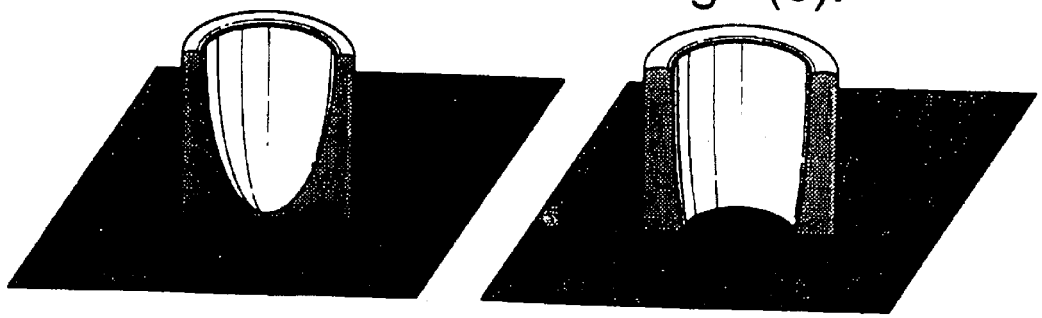
FIG. 1(b) illustrates a cross-sectional view of the printed resist pattern resulting from the "sloped" Dirksen lens aberration monitor structure of FIG. 1(a).
FIG. 1(e) illustrates a cross-sectional view of the printed resist pattern resulting from the "ideal" Dirksen lens aberration monitor structure of FIG. 1(d).
Figure 1C:
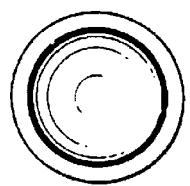
FIG. 1(c) illustrates a top view of the resist pattern illustrated in FIG. 1(b).
Figure 1F:
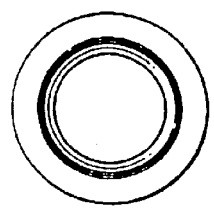
FIG. 1(f) illustrates a top view of the resist pattern illustrated in FIG. 1(e).
Figure 2A:
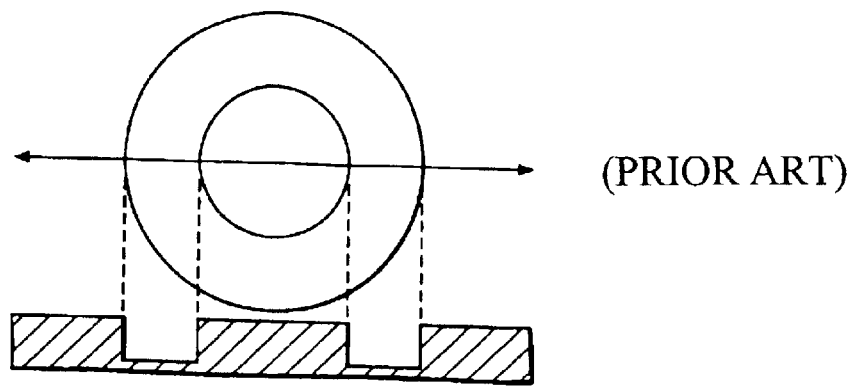
FIG. 2(a) illustrates a top and cross-sectional view of a Dirksen monitor structure modified so as to form a ring-like structure.
Figure 2B:
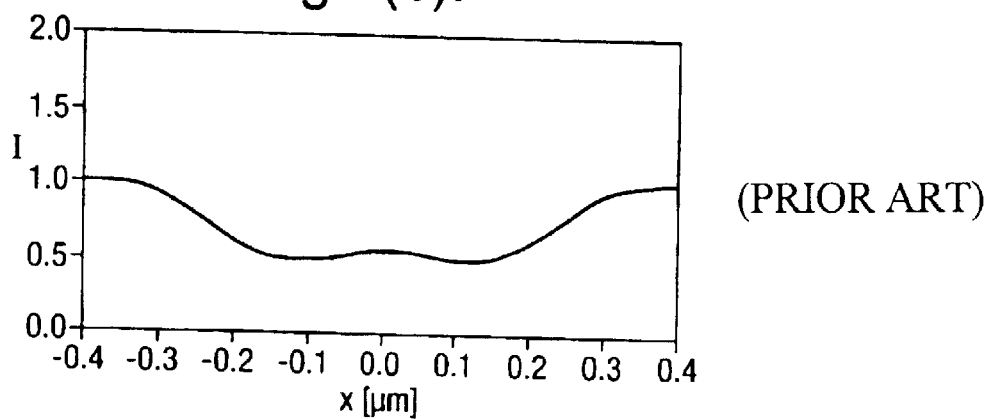
FIG. 2(b) is a one-dimensional cross-sectional aerial image of the ring-like structure monitor of FIG. 2(a).
Figure 2C:
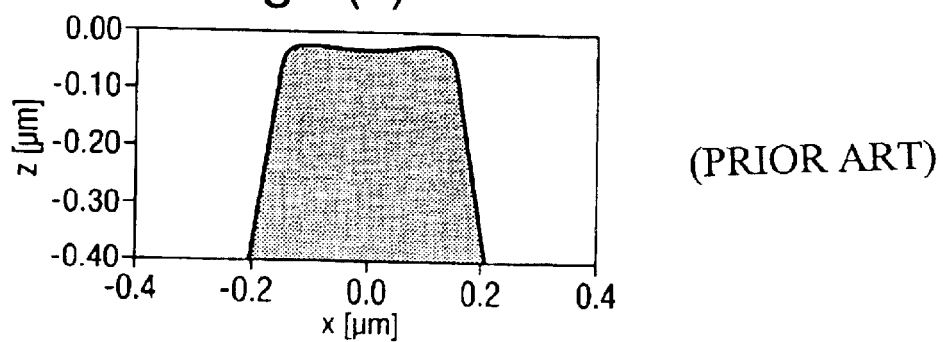
FIG. 2(c) is a cross-sectional view of the printed resist pattern resulting from the ring-like monitor structure of FIG. 2(a).

FIGS. 2(a)–2(c) illustrate the Dirksen monitor structure modified to form a ring-like structure. Specifically, FIG. 2(a) illustrates a top and cross-sectional view of the Dirksen structure modified so as to form a ring-like structure. FIG. 2(b) is a one-dimensional cross-sectional aerial image of the ring-like structure of FIG. 2(a) (in which I indicates intensity). FIG. 2(c) is a cross-sectional view of the printed resist pattern resulting from the ring-like structure of FIG. 2(a). As is clear from a review of FIGS. 2(a)–2(c), the ring-like structure (FIG. 2(a)) does not produce a ring-shaped resist profile. This is due to the fact that the aerial image of the monitor structure does not have sufficient contrast to allow for patterning of a "ring like" resist structure. As a result, the structure of FIG. 2(a) is essentially useless for monitoring lens aberrations. It is noted that the foregoing is accurate as long as the diameter of the monitor structure is in the range of $\lambda/NA$. For a larger diameter, the ring-like design of FIG. 2(a) would likely print a ring-like resist pattern. However, as the diameter becomes larger than $\lambda/NA$, the effectiveness of lens aberration monitoring becomes diminished.

In view of the foregoing, one of the primary objectives of the present invention is to provide a lens aberration monitor having structures with an effective diameter in the range of $\lambda/NA$, which produce an aerial image having log-slopes which are steep enough to be sufficiently sensitive to indicate minute lens aberration.

FIG. 3(a) illustrates an exemplary lens aberration monitor structure 10 in accordance with the present invention. As shown, the lens aberration structure 10, which is referred to as an Octad Halftone Ring (OHR), is a sub-resolution halftoning structure comprising a plurality of sub-resolution features 12. A detailed discussion of the formation of sub-resolution halftoning structures is, for example, set forth in European Patent Application No. EP 0 980 542.

In the embodiment illustrated in FIG. 3(a), the overall shape of the sub-resolution halftoning structure 10 is circular, while each of the features 12 exhibits a square shape. It is noted that the aberration monitor structure 10 of the present invention is not limited to such shapes. Clearly, the overall shape of the sub-resolution halftoning structure 10 can be other than circular, and the shape of each feature 12 can be other than square. It is noted that the square-shaped sub-resolution features 12 are likely to become corner rounded in an actual design due to the nature of the mask making process.

Referring to FIG. 3(a), the size of the individual features 12 and the spacing between the features 12 are as follows. In an exemplary embodiment, the dimension SL of each side of the square features is approximately 0.3($\lambda$/NA) or less. It is noted that the mask making resolution limits the minimum size for sub-resolution features 12. For today's production mask making process, the resolution limit is in the range of approximately 200 nm on a 4x mask. On a 1x wafer scale, this is equivalent to 50 nm. For example, when utilizing a 0.68NA stepper with a KrF exposure source, the size of each square feature 12 can be approximately 100 nm–120 nm per side. In order to maintain a sufficient halftoning effect, it is preferable that the spacing ES between each square feature 12 be less than 0.15 ($\lambda$/NA). Alternatively, the spacing between each feature 12 should be less than about one-half of the square feature's 12 side dimension. It is noted that, as shown in FIG. 3(a), the foregoing spacing requirements refer to the spacing between adjacent features 12. It is further noted that, as shown in FIG. 3(a), the staggered offset in the X and Y direction (respectively XST and YST) are preferably the same. In other words, the portion of a feature 12 overlapping an adjacent feature in either the X direction or the Y direction is preferably the same. In the current embodiment, the preferred staggered offset is in the range of approximately ¼ to ¾ of the sub-resolution element size. Finally, again referring to FIG. 3(a), it is further noted that the distance EES between the inner edges of the two opposing features having the greatest distance therebetween, taken along the X direction (i.e. features 12a, 12b) or the Y direction (i.e. features 12c, 12d), is preferably approximately equal to ($\lambda$/NA). All dimensions are indicated in 1x wafer scale.

In the embodiment of the lens aberration monitor illustrated in FIG. 3(a), the sub-resolution halftoning structure 10 of the present invention utilizes eight square features 12 arranged in a ring-like format. However, as stated, it is not intended that the present invention be so limited. Clearly, it is possible to generate and utilize a sub-resolution halftoning structure that does not exhibit a ring-like shape. It is also possible to form the sub-resolution halftoning structure utilizing a plurality of sub-resolution features having a total number other than eight, as it is possible to utilize features having a shape other than square.

More specifically, although line-like structures (e.g. a pair of parallel lines) can show certain types of lens aberration (e.g. coma), it is desirable to form a "ring-like" structure in order to capture other forms of the lens aberration and their corresponding orientation. Further, because each feature 12 is sub-resolution, the particular shape is not of concern. The size of the feature 12 and halftone spacing is more critical. FIGS. 3(b), 3(c) and 3(d) are examples of various configurations and shapes of the sub-resolution features 12 that can be utilized to form monitor structures. FIGS. 3(e), 3(f) and 3(g) illustrates the actual printing performance of the monitor structures illustrated in FIGS. 3(b), 3(c) and 3(d), respectively. All of the exposures were performed under the same conditions, namely 0.68NA with annular illumination (0.6 inner sigma and 0.8 outer sigma, sigma ($\sigma$) being the so-called Coherence Factor). In addition, in each example, a quantity 0.05$\lambda$ of X and Y coma was purposefully introduced. For all the three examples, the coma lens aberration can be clearly observed from the printed patterns illustrated in FIGS. 3(e), 3(f) and 3(g).

FIGS. 4(a)–4(f) illustrate a comparison of the object spectrums and the aerial images of the Dirksen monitor structure (FIG. 1), the ring-like monitor structure (FIG. 2) and the OHR monitor structure of the present invention (FIG. 3(a)). In the Figures, P indicates phase and I indicates intensity. More specifically, referring first to FIG. 4(a), it is shown that the phase object spectrum of the Dirksen monitor is not symmetrical within the ±NA (numerical aperture) limits. Turning to FIG. 4(b), it is shown that the "ring-like" monitor has a symmetrical phase spectrum but the overall phase range is compressed. However, as explained above and illustrated in FIG. 4(e), the "ring-like" monitor structure exhibits insufficient aerial image contrast, and is therefore incapable of printing a ring-like resist pattern.

Turning to FIG. 4(c), it is shown that the OHR monitor 10 exhibits a symmetrical phase spectrum within the ±NA limits, while having a full phase range from 0 to 360 degrees. The aerial image corresponding to the OHR monitor 10 (as shown in FIG. 4(f)) appears similar to the aerial image produced by the Dirksen monitor (as shown in FIG. 4(d)) when the two are compared at the printing threshold of ≈0.3 to 0.35 intensity levels. However, although it is not readily apparent, at the threshold intensity levels, the log-slopes for inner and outer aerial images are more balanced for the OHR monitor structure 10. This is indicated by the pair of arrows depicted in both FIG. 4(d) and FIG. 4(f).

FIGS. 5(a)–5(c) illustrate the actual printing performance of the OHR lens monitor structure 10 illustrated in FIG. 3(a). The printing conditions utilized to produce FIGS. 5(a)–5(c) are the same as those described above with regard to FIGS. 1(a)–1(f). FIG. 5(a) illustrates a two-dimensional aerial image of the OHR monitor structure 10 as projected on the projection lens (I indicating intensity). FIG. 5(b) illustrates a top view of the original resist patterns (i.e. features 12) overlapped with the resulting OHR monitor structure (i.e. the OHR monitor structure formed as a result of the printing process). As shown in FIGS. 5(a)–5(c), even very subtle coma aberrations can be easily detected by the monitor.

More specifically, the coma aberration (0.025$\lambda$ for both Z7 and Z8) introduced in the simulation can be observed in the 2-D aerial image of FIG. 5(a) as well as in FIG. 5(b). Referring to FIG. 5(b), the aberration is indicated by the shift of the inner ring 14 of the printed OHR structure to the upper right. Finally, FIG. 5(c), which is a cross-sectional view of the printed OHR structure, illustrates that the inner portion 16 of the left side of the printed OHR structure (of the given cross-sectional view) is shifted more towards the center than the corresponding inner portion 17 of the right side of the printed OHR structure. Each of the foregoing shifts/variations of the location of the OHR structure indicates the existence of a lens aberration. In the event there was no lens aberration, the inner ring 14 of FIG. 5(b) would be equally spaced from each of the square features 12 utilized to form the OHR monitor structure 10. In addition, both of the resist patterns 16, 17 of FIG. 5(c) would be equally spaced from the center.

It is noted that in use, the OHR monitor, which is printed in the scribe line or within the die so as to not interfere with the circuit action, would be measured so as to monitor the actual lens aberration in the corresponding exposure field. The lens aberration is then utilized to compute the necessary corrective action required to minimize the CD error. The corrective action can be accomplished, for example, by varying the mask pattern or by tuning the exposure tool. As described herein, the amount of lens aberration can be determined by measuring the relative ring width or the relative position shift of the inner ring circle in relation to a known reference structure that is not sensitive to lens aberration. Another possible method is by taking a SEM photo of the printed OHR pattern and comparing it to a family of OHR patterns with known lens aberrations. Using statistical analysis, it is possible to determine the magnitude and type of lens aberration with reliable repeatability.

One important point regarding the OHR monitor of the present invention is that the performance of the monitor is not degraded as a result of an imperfect mask making process. More specifically, the OHR monitor does not lose lens-aberration detection sensitivity if the quartz etch results in sloped phase edges on the mask. FIG. 6(a) illustrates a top and cross-sectional view of the OHR monitor structure 10 formed in the mask (S indicating the mask substrate), wherein the mask formation process results in square features 12 having sloped edges. The sloped edges are a result of an imperfect quartz edge process utilized during formation of the mask. However, referring to FIG. 6(b), it is shown that the sloped quartz phase-edge patterns on the mask do not have a significant influence on the object phase spectrum. The total object spectrum phase is only slightly compressed (to about 350 degrees). Such compression may result in a very slight reduction in the sensitivity of the lens aberration detection monitor. More importantly, however, even for such an extreme sloppy phase edge, as shown in FIGS. 6(c)–6(e), there is little impact on the printed resist profiles. Thus, in comparison to Dirksen's monitor, the OHR monitor of the present invention provides a much more versatile monitor. It is noted that the printing conditions utilized to produce FIGS. 6(c)–6(e) are the same as those described above with regard to FIGS. 1(a)–1(f).

As previously stated, it is desirable to utilize the lens aberration monitor of the present invention for in-situ monitoring during the production printing process. In order to accomplish this objective, it is necessary to satisfy the following two requirements:

(1) the lens aberration monitor must be made using the same mask making process, with no additional processing steps; and (2) the lens aberration monitor structure must be usable and effective when printed under the same exposure conditions as intended for printing of the production patterns.

The OHR monitor of the present invention is capable of meeting both requirements. FIGS. 7(a)–7(d) demonstrate the ability of the OHR monitor of the present invention to be utilized on a 6% attPSM or a binary chrome mask. It is noted that the printing conditions utilized to produce FIGS. 7(a)–7(d) are the same as those described above with regard to FIGS. 1(a)–1(f).

Figure 7A:
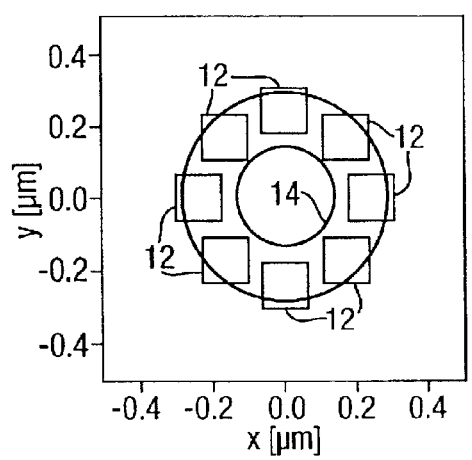
Figure 7B:
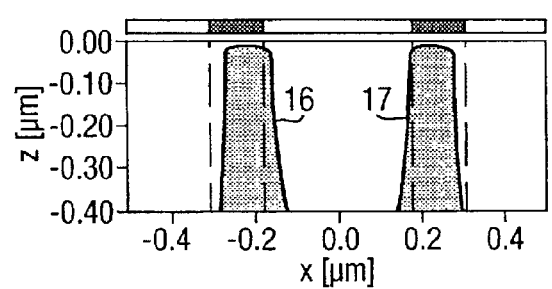
Figure 7C:
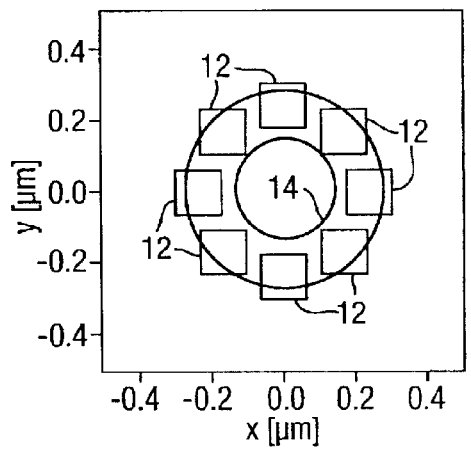
Figure 7D:
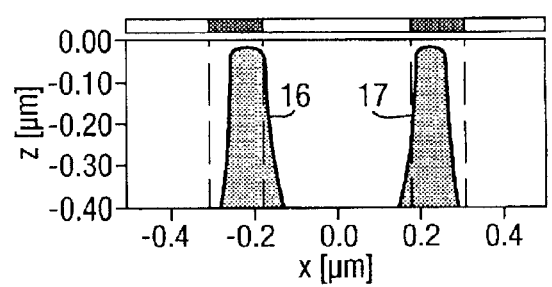

More specifically, FIG. 7(a) illustrates a top view of the resist patterns, which were formed on a 6% attPSM, overlapped with the resulting printed OHR monitor structure. FIG. 7(b) is a cross-sectional view of the printed OHR monitor structure resulting from the resist patterns of FIG. 7(a). FIG. 7(c) illustrates a top view of the resist patterns, which were formed on a binary chrome mask, overlapped with the resulting printed OHR monitor structure. FIG. 7(d) is a cross-sectional view of the printed OHR monitor structure resulting from the resist patterns of FIG. 7(c).

As is clear from FIGS. 7(a)–7(d), both the OHR monitor structure formed utilizing 6% attPSM and the OHR monitor structure formed utilizing the binary chrome mask are capable of detecting minute lens aberrations (e.g. 0.025λ). For example, the inner ring 14 of the resulting OHR monitor structure in both FIGS. 7(a) and 7(c) is shifted in the upper-right direction, in the manner similar to the OHR monitor structure illustrated in FIG. 5(b), thereby effectively detecting the 0.025λ lens aberration introduced in the simulation.

It is noted that in order to ensure that the same exposure levels could be utilized along with the associated product patterns, the dimensions of the OHR square elements 12 were resized to be ≈0.35(λ/NA) for both 6%attPSM and binary chrome mask application. There was no change for the other OHR design parameters. However, due to the use of a slightly larger square element, it may prove necessary to re-tune the spacing between each square element to best optimize the halftoning effect.

As stated above, the OHR monitor of the present invention is quite versatile. For example, in addition to the detection of coma aberrations, as illustrated above in conjunction with FIGS. 5, 6 and 7, the OHR monitor is also capable of detecting various other types of lens aberrations. FIGS. 8(a)–8(h) illustrate the capability of the OHR monitor to detect lens aberrations. It is noted that the printing conditions utilized to produce FIGS. 8(a)–8(h) are the same as those described above with regard to FIGS. 1(a)–1(f), except for the lens aberration settings, and all with +0.1 μm de-focus.

Figure 8A:
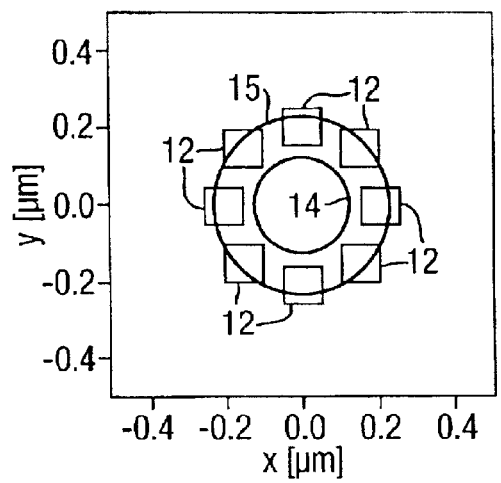
Figure 8E:
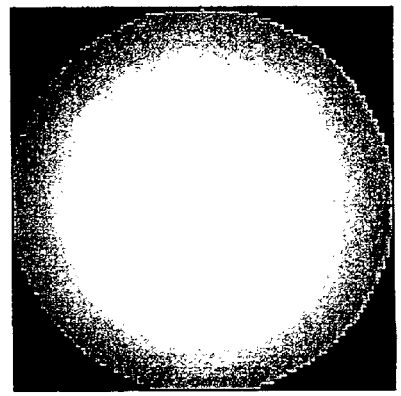

FIG. 8(a) illustrates a top view of the resist patterns utilized to form the OHR monitor structure overlapped with the resulting OHR monitor structure printed from a diffraction-limited lens. FIG. 8(e) illustrates the wavefront at the projection lens pupil corresponding to the OHR monitor of FIG. 8(a). As shown, the printed OHR monitor structure indicates that the lens is substantially aberration free, as both the inner ring 14 and the outer ring 15 are in the expected position.

Figure 8B:
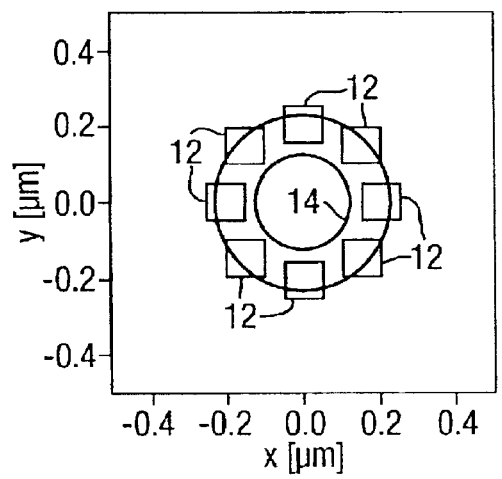
Figure 8F:
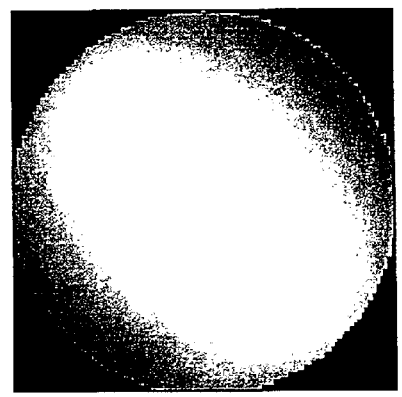

FIG. 8(b) illustrates a top view of the resist patterns of the lens aberration monitor structure printed with a lens aberration of 0.05λ of 45 degree astigmatism, overlapped with the resulting OHR monitor structure. FIG. 8(f) illustrates the wavefront at the projection lens pupil corresponding to the OHR monitor structure of FIG. 8(b). As shown, the printed OHR monitor structure reveals the lens aberration by the elongation of the inner ring 14 about the 45 degree axis.

Figure 8C:
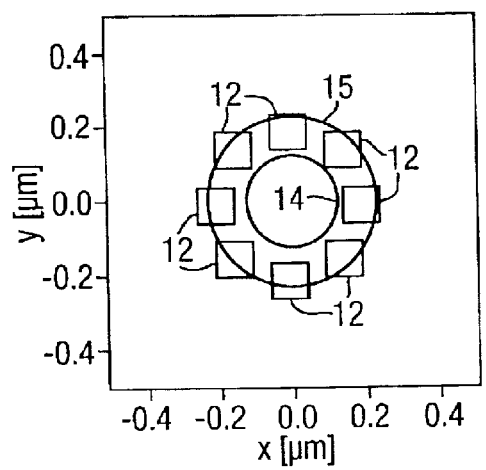
Figure 8G:
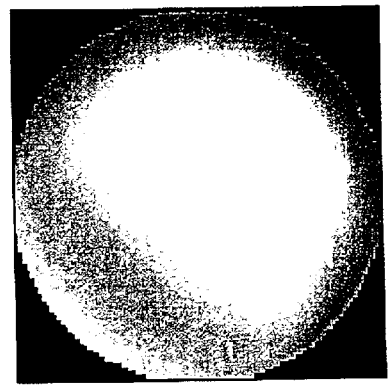

FIG. 8(c) illustrates a top view of the resist patterns of the lens aberration monitor structure printed with a lens aberration of 0.05λ of X and Y coma (Z7 and Z8), overlapped with the resulting OHR monitor structure. FIG. 8(g) illustrates the wavefront at the projection lens pupil corresponding to the OHR monitor structure of FIG. 8(c). As shown, the printed OHR monitor structure indicates the lens aberration by the shifting of both the inner ring 14 and the outer ring 15 in both the upward and right directions.

Figure 8D:
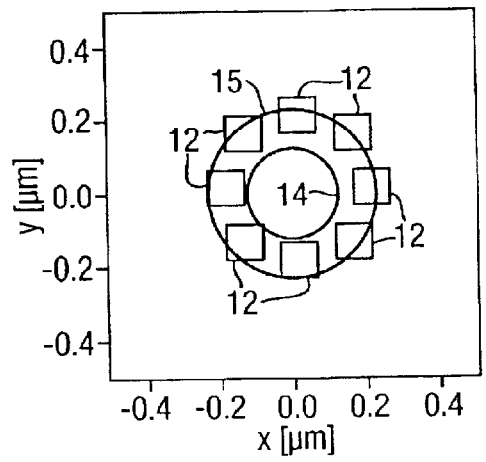
Figure 8H:
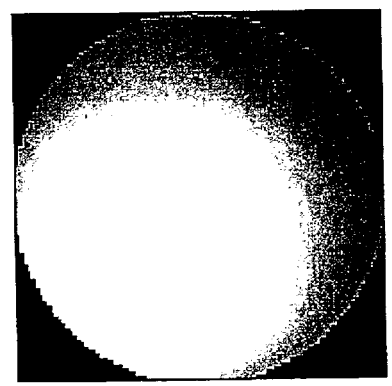

FIG. 8(d) illustrates a top view of the resist patterns of the lens aberration monitor structure printed with a lens aberration of 0.05λ of X and Y tilt (Z2 and Z3), overlapped with the resulting OHR monitor structure. FIG. 8(h) illustrates the wavefront at the projection lens pupil corresponding to the OHR monitor structure of FIG. 8(d). As shown, the printed OHR monitor structure indicates the lens aberration by the shifting of both the inner ring 14 and the outer ring 15 in both the downward and left directions.

Accordingly, even though actual lens aberrations can be very complicated and subtle, by the combined use of the OHR monitor of the present invention and state-of-the-art metrology tools, it is possible to analyze the underlying cause of lens aberrations. It is noted that the lens aberrations identified above in conjunction with FIGS. 8(a)–8(h) are also apparent when viewing the wavefronts projected on the projection lens pupil as illustrated in FIGS. 8(f)–8(h).

FIG. 9 schematically depicts a lithographic projection apparatus suitable for use with the current invention. The apparatus comprises:
- a radiation system Ex, IL, for supplying a projection beam PB of radiation (e.g. UV or EUV radiation). In this particular case, the radiation system also comprises a radiation source LA;
- a first object table (mask table) MT provided with a mask holder for holding a mask MA (e.g. a: reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catadioptric or catoptric optical array) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a Hg lamp, excimer laser, or plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The current invention can, for example, be employed to investigate aberrations in the illuminator IL and/or projection system PL of the apparatus described above.

As mentioned above, variations of the exemplary embodiment of the OHR monitor of the present invention are possible. For example, while the exemplary OHR monitor structure is formed in the shape of a ring, clearly other shapes are possible. In addition, the individual features utilized to form the OHR monitor structure may be formed in a shape other than a square.

Furthermore, the OHR can be utilized in all types of mask, for example, binary chrome, attPSM, alternating PSM, and chromeless PSM. Since the OHR design indicates that such structure and feature spacing can be very sensitive to lens aberration, the OHR design dimensions can be used as a reference for the "forbidden" design rule for integrated circuit design. As such, the circuit features can become less sensitive to minute lens aberrations. This can be extremely important for memory circuit or library circuit design, with the result being enhanced/improved CD control.

As described above, the OHR monitor of the present invention provides important advantages over the prior art. Most importantly, the present invention provides a lens monitor which is capable of detecting very subtle lens aberrations, and which is substantially immune to deficiencies in the masking formation process utilized to form the monitor.

In addition, the lens aberration monitor of the present invention is suitable for in-situ monitoring, as the lens monitor can be formed utilizing the same mask formation process required to form the production mask, and therefore does not require any additional mask formation processing steps. Furthermore, as the overall size of the lens monitor structure is sufficiently small, the structure can be positioned in a sufficient number of positions so as to allow for monitoring of the entire exposure field.

Yet another advantage is that, because the lens aberration monitor structure of the present invention utilizes sub-resolution features, the actual shape and size of the features are not very critical, and therefore the lens aberration monitor is exceedingly effective in detecting aberrations in actual applications.

Finally, it is also noted that although specific reference may be made in the foregoing description to the use of lithographic projection apparatus in the manufacture of integrated circuits, it should be explicitly understood that such apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciated that, in the context of such alternative applications, any use of the terms "reticle" or "wafer" in this text should be considered as being replaced by the more general terms "mask" or "substrate", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

Although certain specific embodiments of the present invention have been disclosed, it is noted that the present invention may be embodied in other specific forms without departing from the spirit or essential characteristics thereof. The present embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

What is claimed is:

1. A method of detecting aberrations associated with an optical system utilized in a lithographic projection apparatus comprising:
    a radiation system for supplying a projection beam of radiation;
    a support structure for supporting patterning means, the patterning means serving to pattern the projection beam according to a desired pattern;
    a substrate table for holding a substrate; and
    a projection system for projecting the patterned beam onto a target portion of the substrate,
    said optical system comprising at least one of the radiation system and projection system,
    said method comprising the steps of:
        providing said desired pattern to comprise a monitor having a plurality of sub resolution features, where the plurality of sub-resolution features are arranged so as to form a predetermined test pattern when projected on the substrate;
        projecting the monitor onto the substrate using the projection system, and;
        analyzing the position of said predetermined test pattern and the position of the plurality of sub-resolution features in the monitor so as to determine if there is an aberration,
        wherein none of said plurality of sub-resolution features are individually imaged on said substrate.

2. The method of claim 1, wherein each of said plurality of sub-resolution features is provided with a square-shaped cross-sectional configuration, said plurality of sub-resolution features being positioned with respect to one another so as to form a substantially circular shape.

3. The method of claim 2, wherein each of said plurality of sub-resolution features is provided with a side length of at most 0.30 ($\lambda$/NA), $\lambda$ being the wavelength of the radiation in the projection beam and NA being the Numerical Aperture of the projection system.

4. The method of claim 3, wherein the spacing between adjacent edges of adjacent sub-resolution features is at most 0.15 ($\lambda$/NA).

5. The method of claim 1, wherein said predetermined test pattern is a substantially ring-shaped pattern.

6. The method of claim 1, wherein, in addition to said monitor, said desired pattern is further provided to comprise a device pattern, corresponding to an integrated device layer to be formed on said substrate.

7. The method of claim 1, wherein a first set of said plurality of sub-resolution features which are adjacent one another overlap in an X-direction, and a second set of said plurality of sub-resolution features overlap in a Y-direction, substantially orthogonal to said X-direction, said overlap in said X-direction being substantially equal to said overlap in said Y-direction.

8. The method of claim 1, wherein the patterning means is provided as mask.

9. The method of claim 8, wherein each of said plurality of sub-resolution features is a $\pi$-phase shifting element.

10. The method of claim 8, wherein said mask is one of a 6% attenuated phase-shift mask and a binary chrome mask.

11. A construction for detecting aberrations in an optical system utilized in a lithographic projection apparatus comprising:
    a radiation system for supplying a projection beam of radiation;
    a mask table for holding a mask;
    a substrate table for holding a substrate; and
    a projection system for projecting a pattern in the mask onto a target portion of the substrate,
    said optical system comprising at least one of the radiation system and projection system,
    said construction comprising a mask plate carrying a monitor pattern, said monitor pattern comprising a plurality of sub-resolution features disposed on said mask plate, said plurality of sub-resolution features arranged so as to form a predetermined test pattern on said substrate, said predetermined pattern being utilized to detect said aberrations,
    wherein none of said plurality of sub-resolution features are individually imaged on said substrate.

12. A construction according to claim 11, further comprising a device pattern disposed on said mask plate and corresponding to an integrated device layer to be formed on said substrate.

13. A device manufacturing method comprising the steps of:
    (a) providing a substrate that is at least partially covered by a layer of radiation-sensitive material;
    (b) providing a projection beam of radiation using a radiation system;
    (c) using patterning means to endow the projection beam with a pattern in its cross-section;
    (d) using a projection system to project the patterned beam of radiation onto a target portion of the layer of radiation-sensitive material,
    wherein, prior to the use of an integrated device pattern in step (d), an aberration monitoring step is performed comprising the steps of:
        providing the pattern of step (C) to comprise a monitor having a plurality of sub-resolution features, where the plurality of sub-resolution features is arranged so as to form a predetermined test pattern when projected on the substrate;
        projecting the monitor onto the substrate using the projection system, and;
        analyzing the position of said predetermined test pattern and the position of the plurality of sub-resolution features in the monitor so as to determine if there is an aberration in at least one of the radiation system and projection system,
        wherein none of said plurality of sub-resolution features are individually imaged on said substrate.

14. A lens aberration monitor for detecting lens aberrations, said monitor comprising:
    a plurality of sub-resolution features disposed on a mask, said plurality of sub-resolution features arranged so as to form a predetermined pattern on a substrate,
    wherein said predetermined pattern is utilized in the detection of said lens aberrations, and wherein none of said plurality of sub-resolution features are individually imaged on said substrate.

15. A computer program product for controlling a computer comprising a recording medium readable by the computer, means recorded on the recording medium for directing the computer to generate at least one file corresponding to a mask for use in a lithographic imaging process, said generation of the file comprising the steps of:

generating data representing a mask pattern for transferring a lithographic pattern onto a substrate, and generating data representing a plurality of sub-resolution features, said plurality of sub-resolution features arranged so as to form a predetermined pattern on said substrate, said predetermined pattern being utilized to detect lens aberrations, wherein none of said plurality of sub-resolution features are individually imaged on said substrate.

16. The computer program product according to claim 15, wherein each of said plurality of sub-resolution features has a square-shaped cross-sectional configuration, said plurality of sub-resolution features being positioned with respect to one another so as to form a circular-shape.

17. The computer program product according to claim 16, wherein each of said plurality of sub-resolution features having said square-shaped cross-sectional configuration, exhibits a length of about 0.30 ($\lambda$/NA) or less per side, where $\lambda$ equals the wavelength of a light source utilized to image said mask and NA equals the numerical aperture of an objective lens used to image the mask onto the substrate.

18. The computer program product according to claim 16, wherein the spacing between adjacent edges of adjacent sub-resolution features is about 0.15 ($\lambda$/NA) or less per side, where $\lambda$ equals the wavelength of a light source utilized to image said mask and NA equals the numerical aperture of an objective lens used to image the mask onto the substrate.

19. The computer program product according to claim 16, wherein a first set of said plurality of sub-resolution features which are adjacent one another overlap in an X-direction, and a second set of said plurality of sub-resolution features overlap in a Y-direction, substantially orthogonal to said X-direction, said overlap in said X-direction being equal to said overlap in said Y-direction.

20. The computer program product according to claim 15, wherein each of said plurality of sub-resolution features is a $\pi$-phase shifting element.

21. The computer program product according to claim 15, wherein said predetermined pattern formed on said substrate is a ring-shaped pattern.

* * * * *